(12) United States Patent
Lew et al.

(10) Patent No.: US 7,604,698 B2
(45) Date of Patent: Oct. 20, 2009

(54) COOLING STRUCTURE FOR BODY OF CRYSTAL-GROWING FURNACE

(75) Inventors: Shiow-Jeng Lew, Taipei (TW); Hur-Lon Lin, Taipei (TW)

(73) Assignee: Green Energy Technology Inc., Taipei (TW)

( * ) Notice: Subject to any disclaimer, the term of this patent is extended or adjusted under 35 U.S.C. 154(b) by 0 days.

(21) Appl. No.: 12/153,917

(22) Filed: May 28, 2008

(65) Prior Publication Data

US 2009/0173277 A1  Jul. 9, 2009

(30) Foreign Application Priority Data

Jan. 3, 2008  (TW) ............................... 97100176 A

(51) Int. Cl.
*C30B 35/00* (2006.01)
(52) U.S. Cl. .................. 117/206; 117/200; 117/900; 373/110
(58) Field of Classification Search ............ 373/110; 117/200, 206, 900
See application file for complete search history.

(56) References Cited

U.S. PATENT DOCUMENTS

| 2,246,643 | A | * | 6/1941 | Uitti | 585/330 |
|---|---|---|---|---|---|
| 2,426,643 | A | * | 9/1947 | Ridgway | 373/81 |
| 4,510,609 | A | * | 4/1985 | Caslavsky et al. | 373/110 |
| 6,540,828 | B2 | * | 4/2003 | Wakita et al. | 117/206 |
| 6,830,618 | B2 | * | 12/2004 | Hara et al. | 117/200 |
| 7,344,594 | B2 | * | 3/2008 | Holder | 117/18 |
| 2003/0234092 | A1 | * | 12/2003 | Brinegar | 164/122.1 |
| 2006/0151148 | A1 | * | 7/2006 | Guyomarc'h | 165/53 |

* cited by examiner

*Primary Examiner*—Felisa C Hiteshew
(74) *Attorney, Agent, or Firm*—Bacon & Thomas, PLLC

(57) ABSTRACT

A cooling structure for the body of a crystal-growing furnace includes an upper body and a lower body. The upper body includes an outer upper shell and an inner upper shell, wherein an upper enclosing space is formed between the outer upper shell and the inner upper shell. The lower body includes an outer lower shell and an inner lower shell, wherein a lower enclosing space is formed between the outer lower shell and the inner lower shell. A plurality of water pipes are arranged, respectively, around the upper and the lower enclosing spaces, wherein plural spraying holes are provided on each of the water pipes. With the help of a pump, water from an outside water source is drawn through the spraying holes of the water pipes so as to cool down the body of the crystal-growing furnace. In adding an exhaust fan, warm air in the upper enclosing spaces can be driven out speedily. Further, in the upper and the lower enclosing spaces there are provided with emergent water pipes for showering more additional water to cool the body of the crystal-growing furnace in case of emergency such that further disaster can be avoided.

7 Claims, 5 Drawing Sheets

COOLING STRUCTURE FOR BODY OF CRYSTAL-GROWING FURNACE

BACKGROUND OF THE INVENTION

1. Field of the Invention

The present invention relates to a cooling structure, more particularly, to a cooling structure adapted for the body of a crystal-growing furnace.

2. Description of Related Art

Referring to FIG. 1, a schematic view illustrating a conventional cooling structure for a crystal-growing furnace, the furnace comprises an upper body 91 and a lower body 92, wherein the upper body 91 includes an outer upper shell 911 and an inner upper shell 912; and the lower body 92 includes an outer lower shell 921 and an inner lower shell 922.

In the upper body 91, an upper enclosing space 910 is formed between the outer upper shell 911 and the inner upper shell 912, whereas in the lower body 92, a lower enclosing space 920 is formed between the outer lower shell 921 and the inner lower shell 922.

As shown in FIG. 1, a pump 94 draws pure water from a reservoir 96 into the upper and lower enclosing spaces 910, 920, via a water feeding pipe 941, cooling the heat effected from the body of the crystal-growing furnace. Heated pure water is, then, drawn back into the reservoir 96 through a water feedback pipe 942, where a cooler 95 and a cooling tower 951 are used for cooling the pure water in the reservoir 96. Further, a water purifier 97 is required for purifying the water. As such, the cost for the facilities and maintenance of the conventional cooling structure for a crystal-growing furnace is significantly high.

Moreover, since the upper and lower enclosing spaces 910, 920 are full of a great amount of cooling pure water, and since unexpected crack may happen to the inner upper shell 912 and the inner lower shell 922 due to long time use or defective manufacture, or malfunction of the furnace, pure water will flow continuously into an inner space 90 of the crystal-growing furnace, where the inner space 90 is under a high-temperature status. As a result, facilities made of graphite will be reacted with the water abruptly, and a great amount of hydrogen ($H_2$), carbon monoxide (CO), and steam released, causing accident on public security such as the whole crystal-growing furnace might be exploded.

SUMMARY OF THE INVENTION

The present invention is to provide a cooling structure for the body of a crystal-growing furnace, comprising an upper body and a lower body, wherein the lower body is attached, upward, to underneath of the upper body so as to form an enclosed furnace chamber. In the furnace chamber there are provided with a heating room, a crucible, heaters, and so forth, relating to a structure for growing multiple crystals of silicon.

The upper body includes an outer upper shell and an inner upper shell, wherein both the outer upper shell and the inner upper shell are cylindrical. The outer upper shell encloses the inner upper shell, and that an upper enclosing space is formed between the outer upper shell and the inner upper shell.

Further, the lower body includes an outer lower shell and an inner lower shell, wherein both the outer lower shell and the inner lower shell have each a bowl-like shape. The outer lower shell encloses the inner lower shell, and that a lower enclosing space is formed between the outer lower shell and the inner lower shell.

At least one water feeding pipe and at least one water inlet pipe are, respectively, arranged around the upper and lower enclosing spaces, wherein plural spraying holes are provided on each of the at least one water feeding pipe and the at least one water inlet pipe.

A pump is provided for being communicated, respectively, with the at least one water feeding pipe and the at least one water inlet pipe. With the help of the pump, water from an outside water source is drawn through the spraying holes of the at least one water feeding pipe and of the at least one water inlet pipe so as to lower down the temperature on the body of the crystal-growing furnace by water spray.

Therefore, in such a manner of water spraying, a cooling effect can be achieved. Moreover, the defects inherent in the conventional art, that a great amount of pure water is required and that a serious accident on public security caused, can be overcome.

Further, according to the present invention, the outer upper shell is provided, at circumference of its lower portion, with plural net-holes as air inlets, and at its top, with an air outlet, such that cool air can enter into the outer upper shell from the air inlets and that warm air be exhausted from the top of the outer upper shell and out of the air outlet.

The upper body may be provided with an exhaust fan which is disposed at the air outlet of the outer upper shell. This exhaust fan can draw and force warm air in the upper enclosing space out of the outer upper shell. This will certainly expedite cooling of the crystal-growing furnace. A plurality of oblique fins are provided around the outer upper shell. The fins are located at upper edges of air inlets for shielding rains and winds, and for guiding ambient air to flow upward and in a direction toward an outlet, such that turbulent airflow may not incur in the upper enclosing space so as to avoid accumulation of heat there.

The outer upper shell can be arranged fully with the net-holes, so that even if the exhaust fan is absent, the upper body can be exposed directly to the ambience and that a cooling effect can still be achieved.

Further, according to the present invention, the upper body may be provided with at least one first water feedback pipe, and that the lower body with at least one second water feedback pipe, where the first water feedback pipe has one end located below the upper enclosing space and another end for guiding water to flow to a reservoir outside the crystal-growing furnace. The second water feedback pipe has one end located below the lower enclosing space and another end for guiding water to flow out of the crystal-growing furnace to the reservoir, such that the water which has not been evaporated may be recycled and reused.

Still further, the upper body and the lower body may each include at least one emergent water pipe disposed around the upper and the lower enclosing spaces, where a plurality of showering holes are provided on the emergent water pipes.

According to the present invention, the pump may include a controlling valve which is connected between the emergent water pipes and the pump. When in an emergency, a controlling signal C is input so as to open the controlling valve, making the pump draw more additional water from the outside water source and, through the plural showering holes of the emergent water pipes, shower on the surface of the inner upper shell and the inner lower shell, such that the body of the crystal-growing furnace can be cooled down rapidly and that further disaster can be avoided.

There is no need for the present invention to use a great amount of pure water to effect cooling. This not only saves costs on facilities such as coolers, cooling towers, purifiers, and their maintenance, but also greatly reduces consumption on electric energy.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
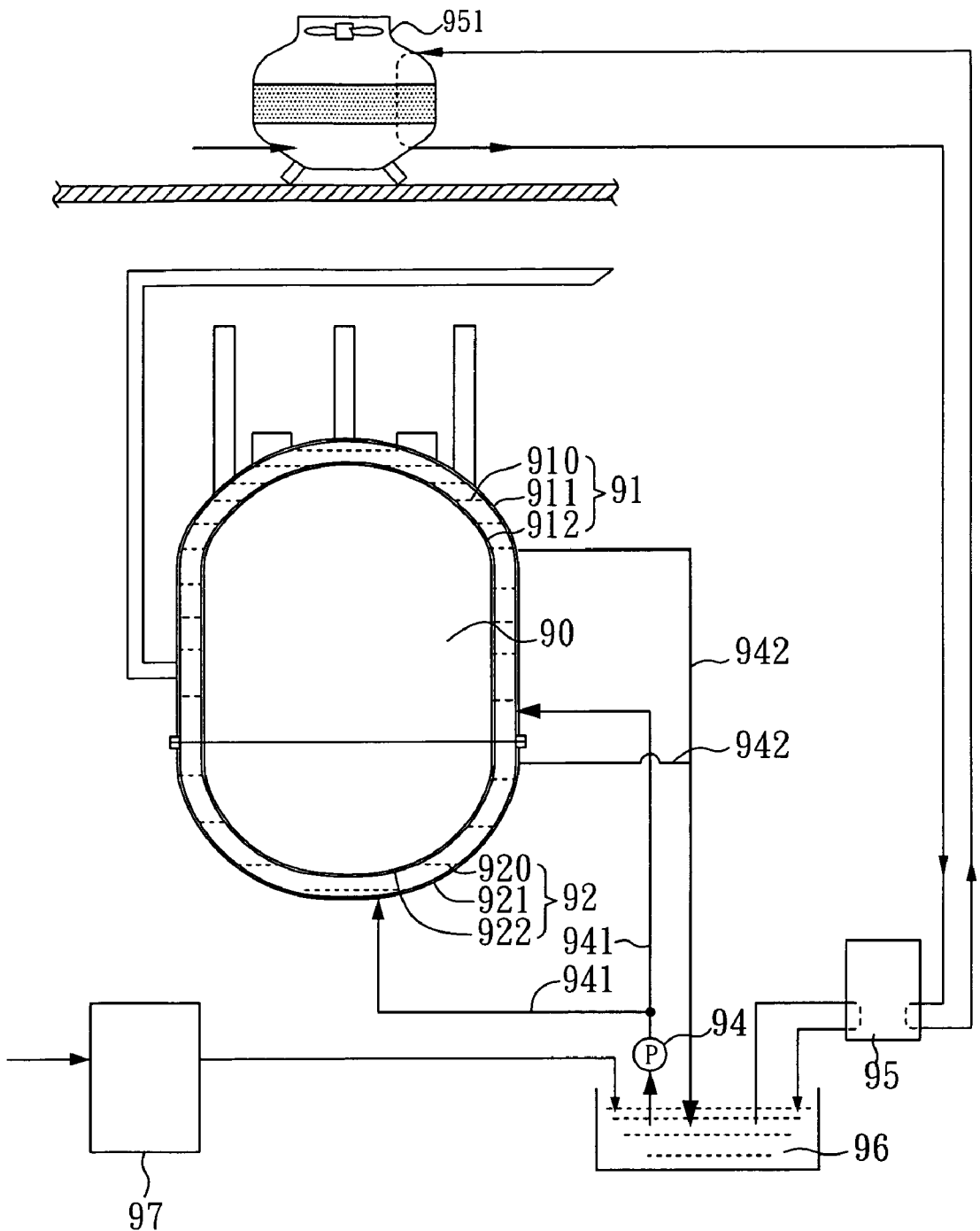
FIG. 1 is a schematic view illustrating a conventional cooling structure for a crystal-growing furnace.
Figure 2:
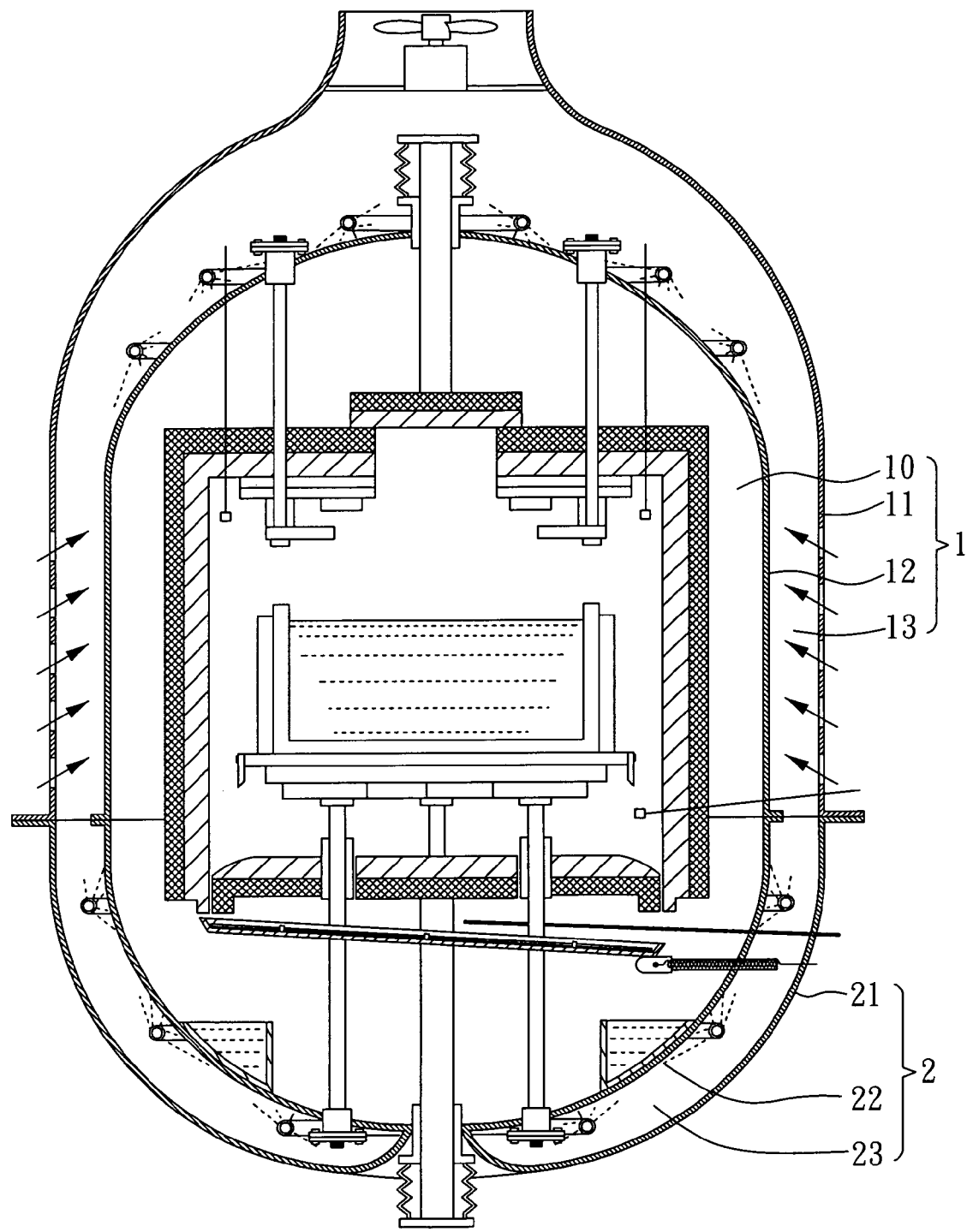
FIG. 2 is a cross-sectional view illustrating a cooling structure for a crystal-growing furnace according to a first embodiment of the present invention.

Referring to FIG. 2, a cross-sectional view illustrating a cooling structure for a crystal-growing furnace according to a first embodiment of the present invention, the cooling structure comprises an upper body 1 and a lower body 2, wherein the lower body 2 is attached, upward, to underneath of the upper body 1 so as to form an enclosed furnace chamber 10. In the furnace chamber 10 there are provided with a heating room, a crucible, heaters, and so forth, relating to a structure for growing multiple crystals of silicon.

According to the present invention, the upper body 1 includes an outer upper shell 11 and an inner upper shell 12, wherein both the outer upper shell 11 and the inner upper shell 12 are cylindrical. The outer upper shell 11 encloses the inner upper shell 12, and that an upper enclosing space 13 is formed between the outer upper shell 11 and the inner upper shell 12.

Further, the lower body 2 includes an outer lower shell 21 and an inner lower shell 22, wherein both the outer lower shell 21 and the inner lower shell 22 have each a bowl-like shape. The outer lower shell 21 encloses the inner lower shell 22, and that a lower enclosing space 23 is formed between the outer lower shell 21 and the inner lower shell 22.

Figure 3:
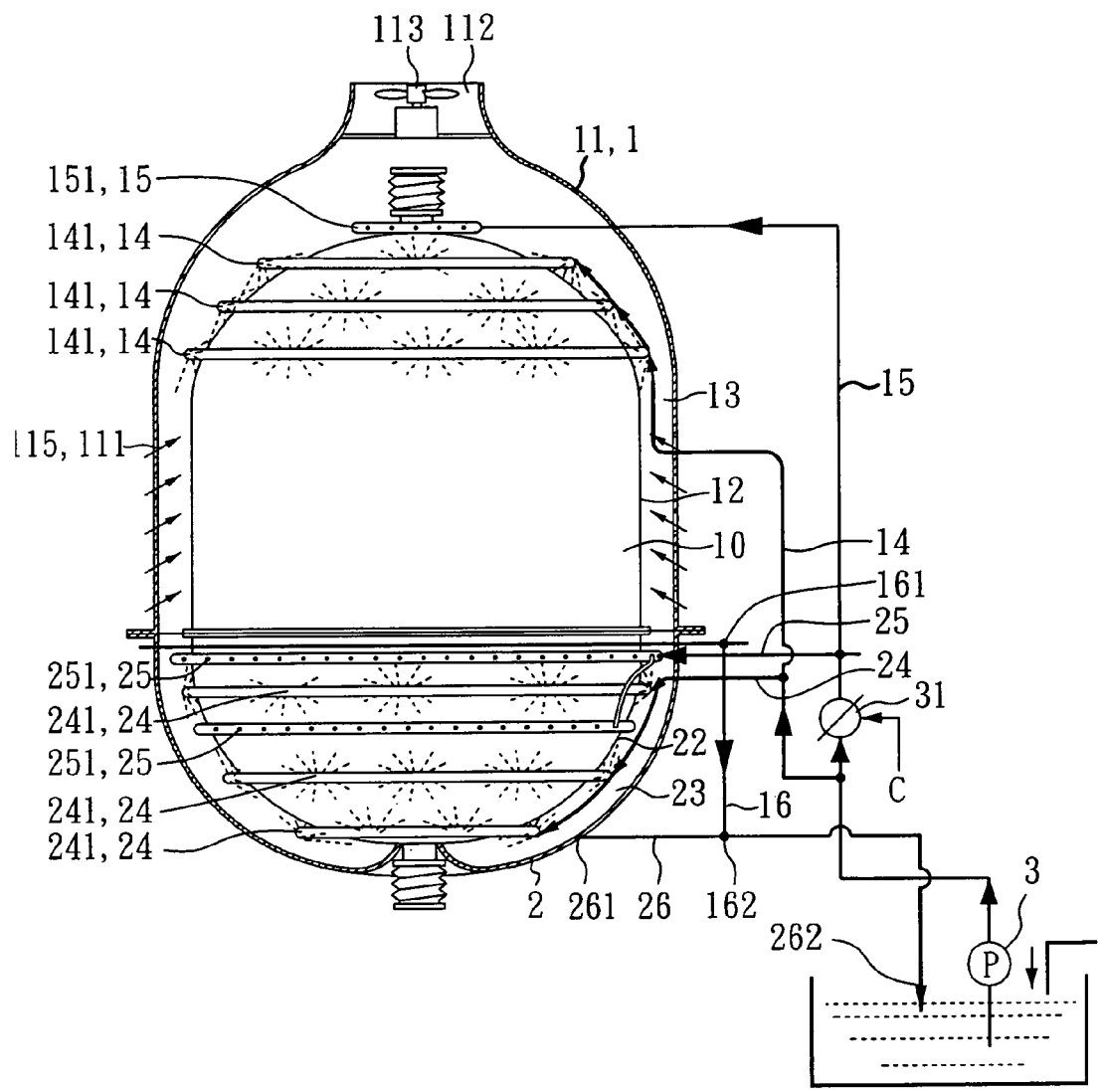
FIG. 3 is a schematic view illustrating the cooling structure for a crystal-growing furnace according to the first embodiment of the present invention.
Figure 4:
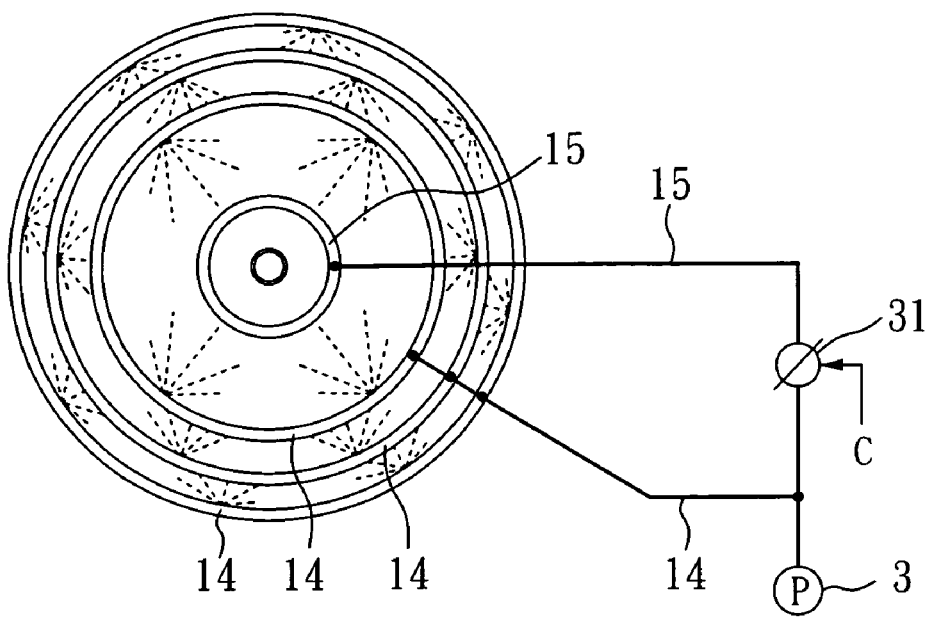
FIG. 4 is a top view illustrating the cooling structure for a crystal-growing furnace according to the first embodiment of the present invention.

Referring now to FIG. 3, a schematic view illustrating the cooling structure for a crystal-growing furnace according to the first embodiment of the present invention; FIG. 4, a top view illustrating the cooling structure; and FIG. 5, a bottom view illustrating the cooling structure, a plurality of water feeding pipes 14 are arranged around the upper enclosing space 13, where several spraying holes 141 are provided on the water feeding pipes 14. A plurality of water inlet pipes 24 are arranged around the lower enclosing space 23, where several spraying holes 241 are provided on the water inlet pipes 24. In the present embodiment, there are three water feeding pipes 14 and three water inlet pipes 24. In principle, the number of the water feeding pipes 14 and the water inlet pipes 24 should be able to spray cooling water uniformly to the inner upper shell 12 and the inner lower shell 22.

As shown in FIG. 3, a pump 3 is provided outside of the upper body 1 and the lower body 2, and is communicated, respectively, with the water feeding pipes 14 and the water inlet pipes 24. With the help of the pump 3, water from an outside water source, for instance a reservoir, is drawn through the spraying holes 141 of the water feeding pipes 14 so as to spray water on the inner upper shell 12, and through the spraying holes 241 of the water inlet pipes 24, to spray on the external surface of the inner upper shell 12 and of the inner lower shell 22, so as to lower down temperature on the body of the crystal-growing furnace.

Therefore, in such a manner of water spraying, a cooling effect can be achieved. Moreover, the defects inherent in the conventional art, that a great amount of pure water is required and that a serious accident on public security caused, can be overcome.

It should be noted that, as shown in FIG. 3, the outer upper shell 11 is provided, at circumference of its lower portion, with plural net-holes 115 as air inlets 111, and at its top, with an air outlet 112, such that cool air can enter into the outer upper shell 11 from the air inlets 111 and that warm air be exhausted from the top of the outer upper shell 11, and out of the air outlet 112.

Further, the upper body 1 may be provided with an exhaust fan 113 which is disposed at the air outlet 112 of the outer upper shell 11. In adding this exhaust fan 113 to draw and force warm air in the upper enclosing space 13 out of the outer upper shell 11. This will certainly expedite cooling of the crystal-growing furnace. Besides, the outer upper shell 11 can be arranged fully with the net-holes 115, so that even if the exhaust fan 113 is absent, the upper body 1 can be exposed directly to the ambience and that a cooling effect can still be achieved.

Figure 5:
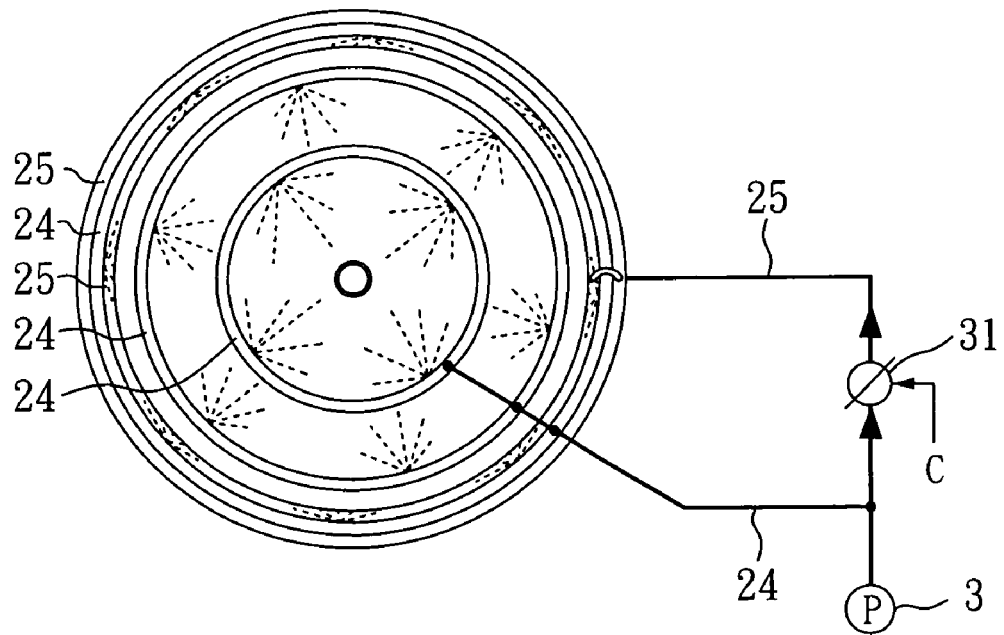
FIG. 5 is a bottom view illustrating the cooling structure for a crystal-growing furnace according to the first embodiment of the present invention.

Referring to FIGS. 3, 4, and 5, the upper body 1 includes an emergent water pipe 15 disposed around the upper enclosing space 13, where a plurality of showering holes 151 are provided on the emergent water pipe 15. Further, the lower body 2 includes two emergent water pipes 25 disposed around the lower enclosing space 23, where a plurality of showering holes 251 are provided on the emergent water pipes 25.

The pump 3 may include a controlling valve 31 which is connected between the emergent water pipes 15,25 and the pump 3. When in an emergency, a controlling signal C is input so as to open the controlling valve 31, making the pump 3 draw more additional water from the outside water source and, through the plural showering holes 151,251, shower on the surface of the inner upper shell 12 and the inner lower shell 22, such that the body of the crystal-growing furnace can be cooled down rapidly and that further disaster can be avoided.

The upper body 1 may be provided with a first water feedback pipe 16 having one end 161 located below the upper enclosing space 13 and another end 162 for guiding water to flow out of the crystal-growing furnace. The lower body 2 may also be provided with a second water feedback pipe 26 having one end 261 located below the lower enclosing space 23 and another end 262 for guiding water to flow out of the crystal-growing furnace to the reservoir, such that the water which has not been evaporated may be recycled and reused.

According to the present invention, there is no need to use a great amount of pure water to effect cooling. This not only saves costs on facilities such as coolers, cooling towers, purifiers, and their maintenance, but also greatly reduces consumption on electric energy.

Figure 6:
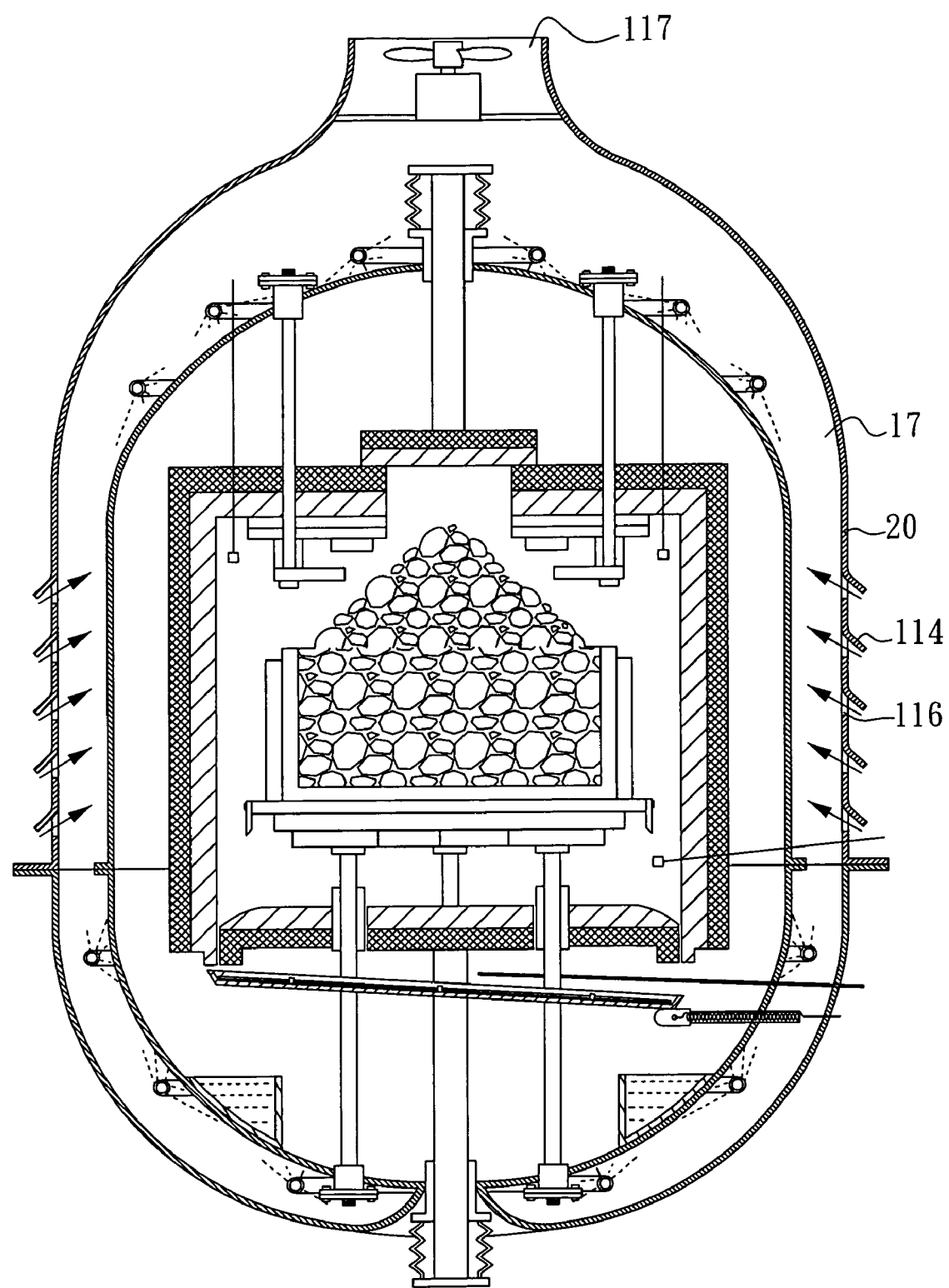
FIG. 6 is a cross-sectional view illustrating a cooling structure for a crystal-growing furnace according to a second embodiment of the present invention.

Referring to FIG. 6, a cross-sectional view illustrating a cooling structure for a crystal-growing furnace according to a second embodiment of the present invention, the second embodiment of the present invention has a structure similar to that of the first embodiment, except that in the second embodiment there are provided with a plurality of oblique fins 114 around an outer upper shell 20. The fins 114 are located at upper edges of air inlets 116 for shielding rains and winds, and for guiding ambient air to flow in a direction toward an outlet 117, such that turbulent airflow may not incur in an upper enclosing space 17 so as to avoid accumulation of heat there.

Although the present invention has been explained in relation to its preferred embodiments, it is to be understood that many other possible modifications and variations can be made without departing from the scope of the invention as hereinafter claimed.

What is claimed is:

1. A cooling structure for a crystal-growing furnace, comprising:
    an upper body and a lower body, the lower body being attached to a bottom portion of the upper body so as to form an enclosed furnace chamber, wherein the upper body includes an outer upper shell and an inner upper shell, both the outer upper shell and the inner upper shell are cylindrical, the outer upper shell encloses the inner upper shell, and an upper enclosing space is formed between the outer upper shell and the inner upper shell;
    at least one water feeding pipe arranged around the upper enclosing space, a plurality of spraying holes being formed in the at least one water feeding pipe; and
    a pump in communication with the at least one water feeding pipe such that water from an outside water source is discharged from the spraying holes of the at least one water feeding pipe so as to spray water on the inner upper shell, wherein the outer upper shell has a plurality of air inlets on a peripheral portion thereof and an air outlet in a top portion thereof.

2. The cooling structure of claim 1, wherein the upper body has an exhaust fan disposed at the air outlet of the outer upper shell.

3. The cooling structure of claim 1, wherein the outer upper shell has a plurality of oblique fins on a peripheral portion at upper edges of the plurality of air inlets.

4. The cooling structure of claim 1, wherein the upper body has at least one first water feedback pipe having a first end located below the upper enclosing space and a second end for guiding water to a location outside of the crystal-growing furnace.

5. The cooling structure of claim 1, wherein the upper body further includes at least one emergent water pipe disposed around the upper enclosing space, a plurality of showering holes being formed in the at least one emergent water pipe,
    wherein the pump includes a controlling valve connected between the at least one emergent water pipe and the pump such that opening of the controlling valve draws additional water from the outside water source and discharges the additional water through the plurality of showering holes in the at least one emergent water pipe.

6. A cooling structure for a crystal-growing furnace, comprising:
    an upper body and a lower body, the lower body being attached to a bottom portion of the upper body so as to form an enclosed furnace chamber, wherein the lower body includes an outer lower shell and an inner lower shell, and the outer lower shell and the inner lower shell are each bowl-shaped, the outer lower shell encloses the inner lower shell, and a lower enclosing space is formed between the outer lower shell and the inner lower shell;
    at least one water inlet pipe arranged around the lower enclosing space, a plurality of spraying holes being formed in the at least one water inlet pipe; and
    a pump in communication with the at least one water inlet pipe, such that water from an outside water source is discharged from the spraying holes of the at least one water inlet pipe so as to spray water on the inner lower shell, wherein the lower bod has at least one second water feedback pipe having a first end located below the lower enclosing space and a second end for guiding water to a location outside of the crystal-growing furnace.

7. The cooling structure of claim 6, wherein the lower body has at least one second water feedback pipe having a first end located below the lower enclosing space and a second end for guiding water to a location outside of the crystal-growing furnace.

* * * * *

UNITED STATES PATENT AND TRADEMARK OFFICE
CERTIFICATE OF CORRECTION

| | | |
|---|---|---|
| PATENT NO. | : 7,604,698 B2 | Page 1 of 1 |
| APPLICATION NO. | : 12/153917 | |
| DATED | : October 20, 2009 | |
| INVENTOR(S) | : Shiow-Jeng Lew et al. | |

It is certified that error appears in the above-identified patent and that said Letters Patent is hereby corrected as shown below:

At column 6, line 31, in claim 6, please replace "bod" with "body".

At column 6, lines 36-40, please replace claim 7 with the following new claim:

7. The cooling structure of claim 6, wherein the lower body further includes at least one emergent water pipe disposed around the lower enclosing space, a plurality of showering holes being formed in the at least one emergent water pipe; and wherein the pump includes a controlling valve connected between the at least one emergent water pipe and the pump such that opening of the controlling valve draws additional water from the outside water source and discharges the additional water through the plurality of showering holes in the at least one emergent water pipe.

Signed and Sealed this
Twelfth Day of July, 2011

David J. Kappos
*Director of the United States Patent and Trademark Office*